(12) United States Patent
Tani

(10) Patent No.: US 6,841,307 B2
(45) Date of Patent: Jan. 11, 2005

(54) PHOTOMASK MAKING METHOD AND ALIGNMENT METHOD

(75) Inventor: Yoshiyuki Tani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 69 days.

(21) Appl. No.: 09/874,367

(22) Filed: Jun. 6, 2001

(65) Prior Publication Data

US 2002/0031712 A1 Mar. 14, 2002

(30) Foreign Application Priority Data

Jun. 6, 2000 (JP) ........................................ 2000-168478

(51) Int. Cl.$^7$ ................................................. G03F 9/00
(52) U.S. Cl. ................................ 430/5; 430/22; 430/30
(58) Field of Search ................................ 430/5, 22, 30

(56) References Cited

U.S. PATENT DOCUMENTS 5,989,759 A * 11/1999 Ando et al. .................... 430/22
6,063,529 A * 5/2000 Hwang ......................... 430/22

* cited by examiner

Primary Examiner—Christopher G. Young
(74) Attorney, Agent, or Firm—Nixon Peabody LLP; Donald R. Studebaker

(57) ABSTRACT

A first on-wafer intended pattern and first and second on-wafer alignment marks have been formed in a reference layer that has been formed on a wafer by using a reference-layer-defining photomask. The first on-wafer intended pattern is a part of an isolation film pattern. The first on-wafer alignment mark has the same width and space as those of the first on-wafer intended pattern. The second on-wafer alignment mark has the same width and space as those of a second intended pattern for a layer-to-be-aligned to be formed on the reference layer. A shift $\Delta x$ is caused between the first and second on-wafer alignment marks because the diffraction of light affects rough and fine patterns on the photomask differently. In performing alignment by reference to the first alignment mark, the position of a mask to be aligned is corrected by the shift $\Delta x$.

11 Claims, 12 Drawing Sheets

Photomask for reference layer

Wafer with reference layer pattern

US 6,841,307 B2

PHOTOMASK MAKING METHOD AND ALIGNMENT METHOD

BACKGROUND OF THE INVENTION

The present invention relates to photomask making method and alignment method for use in an exposure process carried out to fabricate a semiconductor device, for example, and more particularly relates to measures to realize highly accurate alignment (or high alignment accuracy).

Naturally, the advancement or development of photolithography techniques greatly contributes to recent tremendous increase in density of semiconductor devices integrated together per chip. However, it has been getting difficult to attain required alignment accuracy because the design rule has lately been reduced drastically. For example, a KrF excimer laser diode (with a wavelength of 248 nm) was realized lately and devices are being mass-produced in compliance with the design rule of 0.25 μm. On the other hand, the alignment accuracy should be about one third to one fourth of the design rule. This is because the accuracy required must be smaller than the wavelength of a measuring radiation by about one order of magnitude. The advancement of the technology has been improving the mechanical accuracy little by little. However, the improvement of the mechanical accuracy has almost reached a physical or theoretical limit and it has become very difficult to attain the required accuracy.

FIGS. 8A through 8D schematically illustrate the planar layouts of overall pattern for a unit chip among the patterns formed on a known reference-layer-defining photomask, on-mask intended pattern region, on-mask alignment accuracy measuring region and on-mask alignment region, respectively. A mask for defining an isolation film pattern will be described as an example. A "reference layer" herein means a layer in which the pattern of a type of members that should underlie another type of members is defined. A "layer to be aligned" herein means a layer that includes the latter type of members to be aligned with the former type of members in the reference layer. In this example, a layer in which the isolation film pattern is defined will be referred to as a "reference layer". A layer in which gate electrode (or gate line) members are included will be referred to as a "layer to be aligned".

As shown in FIG. 8A, the unit chip region Rtpms of the reference-layer-defining photomask includes the on-mask intended pattern region 101, on-mask alignment accuracy measuring regions 102, and first and second on-mask alignment regions 103a and 103b. An isolation film pattern for transistors to be fabricated in the chip has been defined in the on-mask intended pattern region 101. The on-mask alignment accuracy measuring regions 102 are for use to measure the alignment accuracy. The first and second on-mask alignment regions 103a and 103b are for use to align this photomask with a layer-to-be-aligned-defining photomask.

As shown in FIG. 8B, the on-mask intended pattern region 101 includes an isolation film pattern 111 that has a width of 3.5 μm and a space of 3.5 μm, for example. As shown in FIG. 8C, each of the on-mask alignment accuracy measuring regions 102 includes an on-mask alignment accuracy measuring mark 112 that has planar sizes of 10 μm square. As shown in FIG. 8D, a first group of on-mask alignment marks 113a, which form a line-and-space pattern with a width of 4 μm, a length of 20 μm and a space of 4 μm, are arranged in the on-mask alignment region 103a. Although not shown, the second on-mask alignment region 103b includes a second group of on-mask alignment marks extending vertically to the first group of on-mask alignment marks 113a shown in FIG. 8D. The second group of on-mask alignment marks has the same size as that of the first group of on-mask alignment marks 113a.

FIGS. 9A through 9D are respectively a plan view illustrating a unit chip region of a wafer on which a reference layer pattern has been defined using the reference-layer-defining photomask shown in FIGS. 8A through 8D, a cross-sectional view illustrating an on-wafer intended pattern region, a cross-sectional view illustrating an on-wafer alignment accuracy measuring region and a cross-sectional view illustrating an on-wafer alignment region. As shown in FIG. 9A, the unit chip region Rtpwf of the wafer includes the on-wafer intended pattern region 121, on-wafer alignment accuracy measuring regions 122, and first and second on-wafer alignment regions 123a and 123b. An isolation film pattern for transistors to be fabricated in the chip has been defined in the on-wafer intended pattern region 121. Each of the on-wafer alignment accuracy measuring regions 122 includes an alignment accuracy measuring mark for measuring the alignment accuracy. The first and second on-wafer alignment regions 123a and 123b include alignment marks that are necessary for the alignment with a layer-to-be-aligned pattern. As shown in FIG. 9B, an on-wafer intended pattern 132 has been defined in the on-wafer intended pattern region 121 on an Si wafer 120. The on-wafer intended pattern 132 is formed by an isolation film 131 and the wafer surface surrounded with the isolation film 131. As shown in FIG. 9C, an on-wafer alignment accuracy measuring mark 133 has been formed in each of the on-wafer alignment accuracy measuring regions 122 on the Si wafer 120. The on-wafer alignment accuracy measuring mark 133 is formed by the isolation film 131 and the wafer surface surrounded with the isolation film 131. And as shown in FIG. 9D, on-wafer alignment marks 134 have been formed in the first and second on-wafer alignment regions 123a and 123b on the Si wafer 120. The on-wafer alignment marks 134 are formed by the isolation film 131 and the wafer surface surrounded by the isolation film 131.

FIGS. 10A through 10D schematically illustrate the planar layouts of overall pattern for a unit chip among the paterns formed on a known layer-to-be-aligned-defining photomask, on-mask intended pattern region, on-mask alignment accuracy measuring region and on-mask alignment region, respectively.

As shown in FIG. 10A, the unit chip region Rtpms includes the intended pattern region 151, alignment accuracy measuring regions 152, and first and second alignment regions 153a and 153b. A gate electrode (or gate line) pattern for transistors to be fabricated in the chip has been defined in the intended pattern region 151. The alignment accuracy measuring regions 152 are for use to measure the alignment accuracy. The first and second alignment regions 153a and 153b are provided for the purpose of the alignment with a photomask that will be used in the next process step.

As shown in FIG. 10B, the intended pattern region 151 includes a gate electrode (polysilicon film) pattern 161 made up of multiple gate electrodes, which are arranged to have a width of 0.5 μm and a space of 0.5 μm, for example and each three of which will make a set. As shown in FIG. 10C, each of the alignment accuracy measuring regions 152 includes an alignment accuracy measuring mark 162 that has planar sizes of 5 μm square. And as shown in FIG. 10D, a first group of alignment marks 163a, which will make a reference layer pattern in the next process step and which forms a line-and-space pattern with a width of 4 μm, a length of 20

μm and a space of 4 μm, are arranged in the first alignment region 153a. Although not shown, the second alignment region 153b includes a second group of alignment marks extending vertically to the first group of alignment marks 163a. The second group of alignment marks forms a line-and-space pattern and has the same sizes as those of the first group of alignment marks 163a.

FIGS. 11A through 11D are respectively a plan view illustrating a unit chip region of a wafer on which a layer-to-be-aligned pattern has been defined using the layer-to-be-aligned-defining photomask shown in FIGS. 10A through 10D, a cross-sectional view illustrating an on-wafer intended pattern region, a cross-sectional view illustrating an on-wafer alignment accuracy measuring region and a cross-sectional view illustrating an on-wafer alignment region.

As shown in FIG. 11A, the unit chip region Rtpwf of the wafer includes the on-wafer intended pattern region 171, on-wafer alignment accuracy measuring regions 172, and first and second on-wafer alignment regions 173a and 173b. An isolation film pattern for transistors to be fabricated in the chip has been defined in the on-wafer intended pattern region 171. Each of the on-wafer alignment accuracy measuring regions 172 includes an on-wafer alignment accuracy measuring mark for measuring the alignment accuracy. The first and second on-wafer alignment regions 173a and 173b include alignment marks that are necessary for the alignment with a photomask to be used in the next process step. As shown in FIGS. 11B through 11D, a polysilicon film 181 for forming gate electrodes and a masking photoresist film 182 for patterning the polysilicon film 181 have been formed on the intended pattern region of the Si wafer.

As shown in FIG. 11B, the on-wafer intended pattern 132 (gate pattern) has already been defined for the reference layer by the isolation film 131 and wafer surface in the on-wafer intended pattern region 171. An on-wafer intended pattern 183 is going to be formed for the layer-to-be-aligned on the on-wafer intended pattern 132 so that gate electrodes will be arranged three by three at a width of 0.5 μm and a space of 0.5 μm. For that purpose, the mask is automatically aligned by reference to the on-wafer alignment marks 134 for the reference layer shown in FIG. 9A. Thereafter, the photoresist film 182 is exposed and developed and thereby defining a resist pattern for forming the gate electrodes, alignment accuracy measuring marks (see the parts indicated by broken lines) and alignment marks for the next process step, for example.

Also as shown in FIG. 11C, each of the alignment accuracy measuring regions 172 has a box-in-box pattern with an outer frame of 10 μm square and an inner frame of 5 μm square. The box-in-box pattern is formed by the on-wafer alignment accuracy measuring mark 133 for the reference layer and a resist pattern 184 for the layer-to-be-aligned, which is formed inside the on-wafer alignment accuracy measuring mark 133. An alignment error (mask misalignment) between the gate electrode pattern (intended pattern) to be formed using this resist pattern and the pattern of the underlying isolation film 131, for example, can be read by the relative positional relationship between the outer and inner frames of the box-in-box pattern. This it to say, the alignment accuracy can be measured.

Furthermore, as shown in FIG. 11D, a resist pattern 185 for forming reference alignment marks (out of the polysilicon film 181) for use in the next alignment process step through patterning is defined in the resist film 182 for forming the gate electrodes for the layer-to-be-aligned.

If the alignment error exceeds a predetermined value, the photoresist film is removed, the relative positional relationship between the wafer and photomask is corrected and a resist pattern is defined all over again.

FIG. 12 is a cross-sectional view illustrating the shapes of aligner, photomask and wafer in an exposure process. Normally, a stepping demagnification projection aligner (stepper) is used for an exposure process in a photolithography process. Although an objective lens for the stepper is illustrated as a thin one in FIG. 12, the optical system actually used is a complicated combination of many lenses and mechanisms.

Suppose that a photoresist film for defining intended pattern, alignment accuracy measuring mark pattern and alignment mark pattern, for example, has already been formed on the wafer and that those patterns are classifiable into rough and fine patterns. Accordingly, rough and fine pattern regions for defining the rough and fine patterns have been formed on the photomask. The intended and alignment mark patterns are formed in the photoresist film on the wafer by allowing the light that has been transmitted through the photomask to pass through the objective lens. As a result, the latent images of the rough and fine patterns are formed in the photoresist film. When the photoresist film is developed, a resist pattern is formed. Thereafter, etching and other processes are performed using the resist pattern as a mask, thereby forming rough and fine pattern members (e.g., isolation film, gate electrodes, alignment accuracy measuring marks, and alignment marks) on the wafer.

If a demagnification projection alinger is used, a photomask has a pattern that is several times greater in size than a pattern to be defined on a wafer. However, in FIG. 12, the pattern on the photomask is shown as if the pattern on the photomask were of the same size as the pattern on the wafer for the sake of simplicity of description.

Generally speaking, objective lenses provided for the stepper needs to be almost ideal ones and are made by making full use of the cutting-edge technology. However, it is well known that the objective lenses actually cause some distortion or aberration. The aberration is roughly classifiable into the five types of: distortion; curvature of field; coma; spherical; and astigmatic aberrations. Among other things, the coma and spherical aberrations affect the alignment accuracy seriously.

It is also generally known that the coma and spherical aberrations have pattern size dependence, thus shifting the position of a pattern horizontally, i.e., causing a misalignment.

The coma and spherical aberrations have pattern size dependence. Accordingly, if a position on a wafer onto which a photomask pattern is transferred (resist pattern position) when there are no aberrations at all is regarded as an ideal position, a position on the wafer onto which the resist pattern is actually defined shifts from the ideal position to some extent. In that case, the diffraction of light affects the fine patterns more seriously than the rough patterns. Thus, the fine patterns tend to be misaligned more greatly than the rough patterns. This misalignment can be corrected by adjusting the space between adjacent objective lenses, the tilt angles of the lenses, and the air pressure (refractive index), for example. Anyway, the shift of a rough pattern from its ideal position is different from that of a fine pattern from its ideal position.

FIG. 13 is a view illustrating how the positions of gate electrodes shift due to the pattern dependence of the aberrations. Suppose the alignment marks can be read and the resist pattern or the gate electrode pattern can be formed with no errors in this example. In that case, since the aberrations have some pattern size dependence as described above, the isolation film pattern (line-and-apace pattern with a width of 3.5 µm) as an intended reference layer pattern as shown in FIG. 9B and the gate electrode pattern (line-and-apace pattern with a width of 0.5 µm) as an intended layer-to-be-aligned pattern as shown in FIG. 11B have mutually different relative positions by reference to the reference position of an alignment mark. As a result, supposing the distance between an isolation film edge and the reference position of the alignment mark is "x" and the ideal distance between an edge of a gate electrode and the isolation film edge is "y", the distance of the edge of the gate electrode actually formed from the isolation film edge is greater than the ideal distance "y" by "Δy" due to the pattern size dependence of the aberration.

Similarly, the outer and inner frames of an alignment accuracy measuring mark pattern also have mutually different pattern sizes. Thus, the pattern size dependence makes the actual relative positional relationship between the outer and inner frames different from the intended one. Accordingly, the alignment accuracy might be read erroneously.

That is to say, the accuracy of the photolithographic process might be deteriorated due to the pattern size dependence of the coma and spherical aberrations. In other words, improvement in the mechanical accuracy of optical members for use in the photolithographic process might not result in sufficient improvement in the accuracy of the photolithographic process.

SUMMARY OF THE INVENTION

The present invention was made by paying special attention to the fact that aberrations caused by optical members have pattern size dependence. Thus, an object of the present invention is to improve the accuracy of a photolithographic process by making a photomask or performing alignment with the pattern size dependence taken into account.

In a first inventive method for making a photomask, a first on-mask intended pattern for forming a first on-wafer intended pattern and an on-mask alignment mark are formed on a reference-layer-defining photomask. The on-mask alignment mark has a size equal to that of a second on-wafer intended pattern to be defined in a layer-to-be-aligned.

In this method, even if a first on-wafer intended pattern for a reference layer has a size different from that of a second on-wafer intended pattern for a layer-to-be-aligned, a layer-to-be-aligned-defining photomask can be aligned by reference to an on-wafer alignment mark formed by transferring an on-mask alignment mark having a size equal to that of the second on-wafer intended pattern. The size of the second intended pattern, which will be formed for the layer-to-be-aligned later, is equal to that of the on-wafer alignment mark. Accordingly, the shifts caused by the diffraction of light are substantially equal to each other. As a result, a positional relationship between the first intended pattern for the reference layer and the second intended pattern for the layer-to-be-aligned has almost no error resulting from the diffraction of light, thus improving the alignment accuracy.

In one embodiment of the present invention, the size of the on-mask alignment mark may be equal to the smallest size of the second on-wafer intended pattern to be defined in the layer-to-be-aligned. In such an embodiment, the risk of creating the largest misalignment is avoidable.

In another embodiment, a second on-mask alignment mark having a size equal to that of the first on-mask intended pattern may also be formed on the reference-layer-defining photomask. Then, the position of a mask to be aligned can be corrected in accordance with the shift between the on-wafer alignment marks formed by transferring the two marks onto a wafer. Thus, the alignment accuracy further improves.

In a second inventive method for making a photomask, a first on-mask alignment accuracy measuring mark that has a size equal to that of a first on-mask intended pattern is formed on a reference-layer-defining photomask, while a second on-mask alignment accuracy measuring mark that has a size equal to that of a second on-mask intended pattern is formed on a layer-to-be-aligned-defining photomask.

According to this method, the alignment accuracy can be improved more easily than the first photomask making method.

In one embodiment of the present invention, the size of the second on-mask alignment accuracy measuring mark is preferably equal to the smallest size of the second on-wafer intended pattern.

A first inventive alignment method includes the step of a) preparing a reference-layer-defining photomask on which a first on-mask intended pattern and an on-mask alignment mark have been formed. The first on-mask intended pattern is used for defining a first on-wafer intended pattern in a reference layer. The on-mask alignment mark has a size equal to that of a second on-wafer intended pattern to be defined in a layer-to-be-aligned. The method further includes the step of b) preparing a layer-to-be-aligned-defining photomask that includes at least a second on-mask intended pattern for defining the second on-wafer intended pattern in the layer-to-be-aligned. The method further includes the step of c) forming the first on-wafer intended pattern and an on-wafer alignment mark on a wafer by using the reference-layer-defining photomask. The on-wafer alignment mark is formed by transferring the on-mask alignment mark. And the method further includes the step of d) aligning the layer-to-be-aligned-defining photomask by reference to the position of the on-wafer alignment mark for the reference-layer.

In this method, even if a first on-wafer intended pattern for a reference layer has a size different from that of a second on-wafer intended pattern for a layer-to-be-aligned, a layer-to-be-aligned-defining photomask can be aligned by reference to an on-wafer alignment mark formed by transferring an on-mask alignment mark having a size equal to that of the second on-wafer intended pattern. The size of the second intended pattern for the layer-to-be-aligned is equal to that of the on-wafer alignment mark. Accordingly, the shifts caused by the diffraction of light are substantially equal to each other. As a result, a positional relationship between the first on-wafer intended pattern for the reference layer and the second on-wafer intended pattern for the layer-to-be-aligned has almost no error resulting from the diffraction of light, thus improving the alignment accuracy.

In one embodiment of the present invention, a second on-mask alignment mark that has a size equal to that of the first on-mask intended pattern may be formed in the step a) on the reference-layer-defining photomask. In the step c), a second on-wafer alignment mark may be formed on the wafer by transferring the second on-mask alignment mark. And in the step d), the position of the layer-to-be-aligned-defining photomask may be corrected by reference to a positional relationship between the on-wafer alignment mark and the second on-wafer alignment mark. In such an embodiment, the position of a mask to be aligned can be corrected in accordance with the shift between the on-wafer alignment marks. Thus, the alignment accuracy further improves.

A second inventive alignment method includes the step of a) preparing a reference-layer-defining photomask on which a first on-mask alignment accuracy measuring mark and an on-mask alignment mark have been formed. The first on-mask alignment accuracy measuring mark has a size equal to that of a first on-wafer intended pattern for, a reference layer. The on-mask alignment mark has a size equal to that of a second on-wafer intended pattern to be defined in a layer-to-be-aligned. The method further includes the step of b) preparing a layer-to-be-aligned-defining photomask that includes at least a second on-mask intended pattern for defining the second on-wafer intended pattern in the layer-to-be-aligned. The method further includes the step of c) forming the first on-wafer intended pattern and an on-wafer alignment accuracy measuring mark on a wafer by using the reference-layer-defining photomask. The on-wafer alignment accuracy measuring mark is formed by transferring the on-mask alignment accuracy measuring mark. And the method further includes the step of d) aligning the layer-to-be-aligned-defining photomask by reference to the position of the on-wafer alignment accuracy measuring mark for the reference layer.

According to this method, the position of a mask to be aligned can be corrected more easily than the first alignment method, thus improving the alignment accuracy.

BRIEF DESCRIPTION OF THE DRAWINGS

FIGS. 11A through 11D are respectively a plan view illustrating a unit chip region of a wafer on which a layer-to-be-aligned pattern has been defined using the known layer-to-be-aligned-defining photomask, a cross-sectional view illustrating an on-wafer intended pattern region, a cross-sectional view illustrating an on-wafer alignment accuracy measuring region and a cross-sectional view illustrating an on-wafer alignment region.

DESCRIPTION OF THE PREFERRED EMBODIMENTS

Hereinafter, embodiments of the present invention will be described with reference to the accompanying drawings.

Embodiment 1

FIGS. 1A through 1D schematically illustrate the planar layouts of overall pattern for a unit chip among the patterns formed on a reference-layer-defining photomask, on-mask intended pattern region, and first and second on-mask alignment regions, respectively, in accordance with this embodiment. In this embodiment, a mask for defining an isolation film pattern will be described as an example. A "reference layer" herein means a layer in which the pattern of a type of members that should underlie another type of members is defined. A "layer-to-be-aligned" herein means a layer that includes the latter type of members to be aligned with the former type of members in the reference layer. In this embodiment, a layer in which the isolation film pattern is defined will be referred to as a "reference layer". A layer in which gate electrode (or gate line) members are included will be referred to as a "layer-to-be-aligned".

Figure 1A:
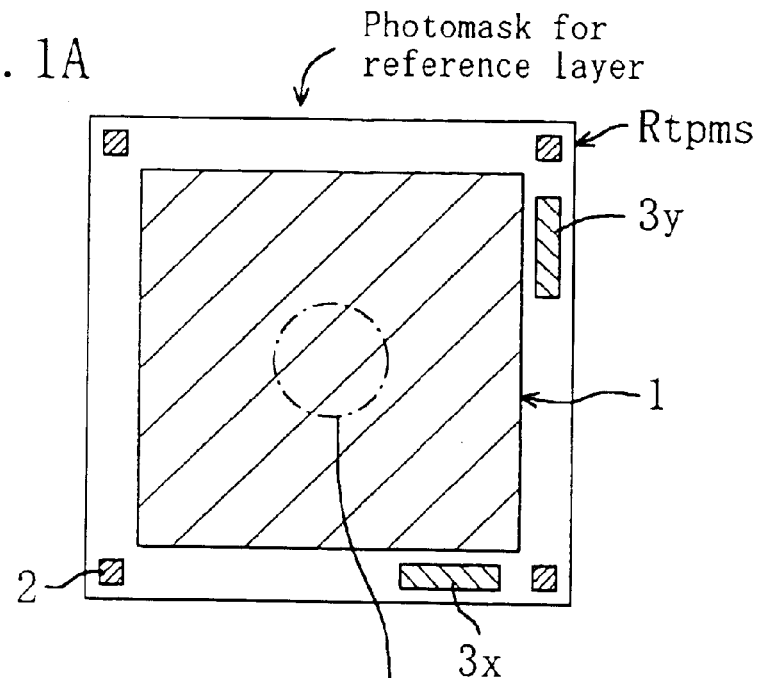
FIGS. 1A through 1D schematically illustrate the planar layouts of overall pattern for a unit chip among the patterns formed on a reference-layer-defining photomask, on-mask intended pattern region, and first and second on-mask alignment regions, respectively, in accordance with a first embodiment.

As shown in FIG. 1A, the unit chip region Rtpms of the reference-layer-defining photomask includes the on-mask intended pattern region 1, on-mask alignment accuracy measuring regions 2, and first and second on-mask alignment regions 3$x$ and 3$y$. An isolation film pattern for transistors to be fabricated in the chip has been defined in the on-mask intended pattern region 1. The on-mask alignment accuracy measuring regions 2 are for use to measure the alignment accuracy. The first and second on-mask alignment regions 3x and 3y are for use in the alignment with a layer-to-be-aligned.

Figure 1B:
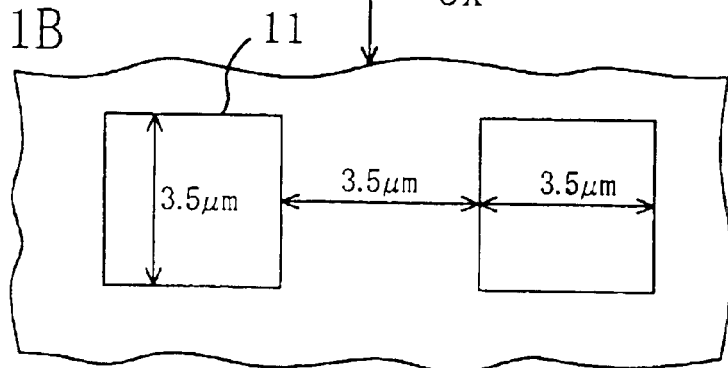

As shown in FIG. 1B, the on-mask intended pattern region 1 includes an isolation film pattern 11 that has planar sizes of 3.5 μm square and a space of 3.5 μm, for example.

Figure 1C:
Figure 1B:
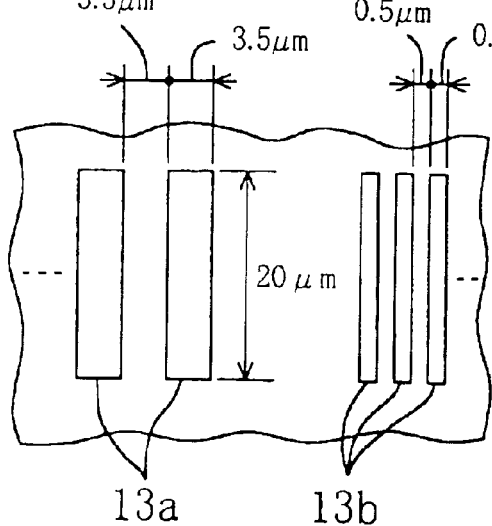

As shown in FIG. 1C, a first group of on-mask alignment marks 13a and a second group of on-mask alignment marks 13b are arranged in the first on-mask alignment region 3x. The first group of on-mask alignment marks 13a form an elongated line-and-space pattern with a width of 3.5 μm, a length of 20 μm and a space of 3.5 μm. The second group of on-mask alignment marks 13b form an elongated line-and-space pattern with a width of 0.5 μm, a length of 20 μm and a space of 0.5 μm.

Figure 1D:
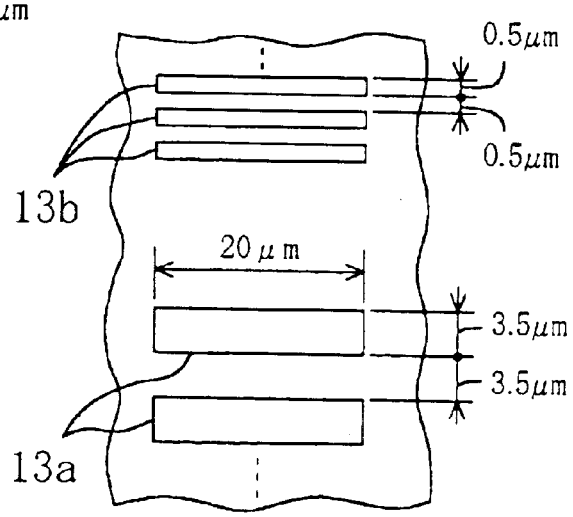

Also, as shown in FIG. 1D, the second on-mask alignment region 3y includes an alignment mark pattern, in which the first and second groups of on-mask alignment marks 13a and 13b are formed vertically to the counterparts of the first on-mask alignment region 3x.

Although not shown, each of the on-mask alignment accuracy measuring regions 2 includes an alignment accuracy measuring mark with planar sizes of 10 μm square as in the known reference-layer-defining photomask.

Figure 2:
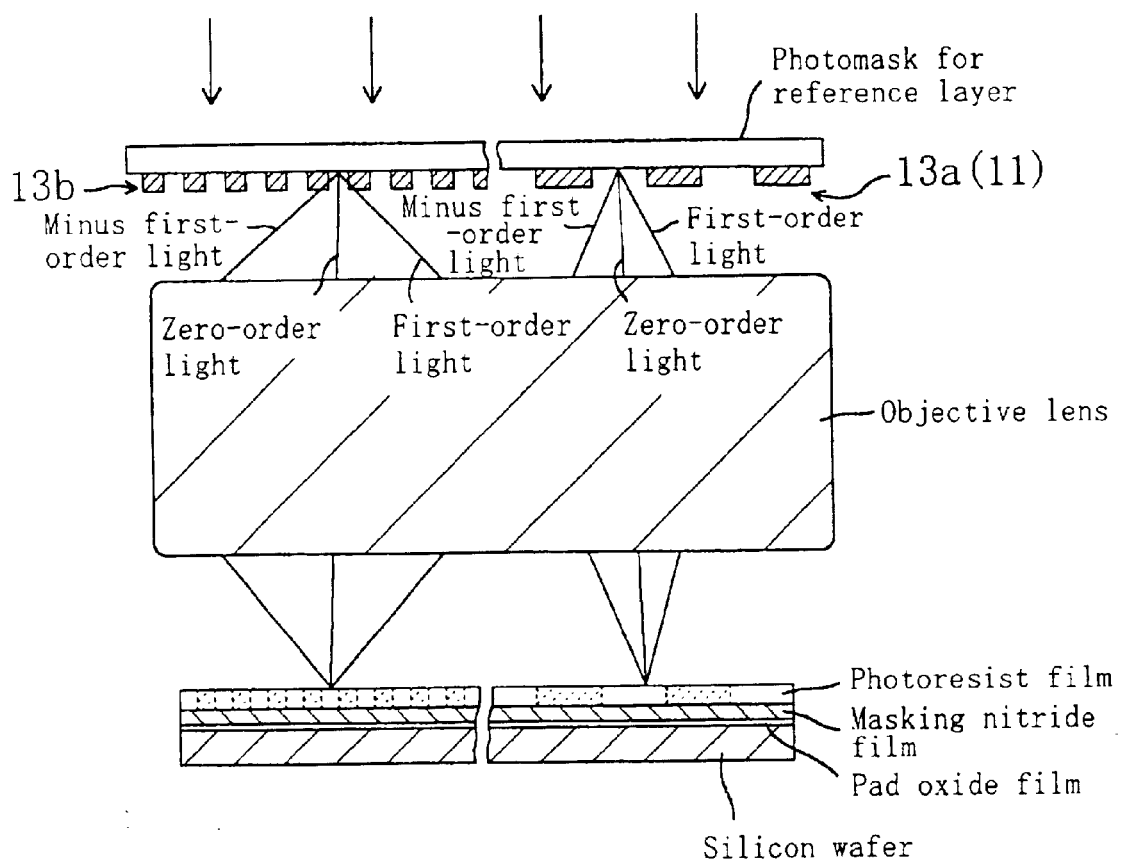
FIG. 2 schematically illustrates how an exposure process is performed using a KrF excimer laser stepper including the reference-layer-defining photomask in accordance with the first embodiment.

Next, FIG. 2 schematically illustrates how an exposure process is performed using a KrF excimer laser stepper including the reference-layer-defining photomask shown in FIGS. 1A though 1C. In this embodiment, an isolation film pattern is formed as a reference layer pattern by a LOCOS process. At this point in time, a nitride film to be a mask when a LOCOS film is formed by thermal oxidation and an oxide film to be a pad thereof have already been formed on an Si wafer. Then, a reference layer pattern is transferred by an exposure process onto a photoresist film that has been applied on the nitride film. Thereafter, a nitride film mask and a pad oxide film thereof are formed by performing a dry etching process using the photoresist film pattern as a mask. Then, surface regions of the Si wafer, which are located inside the openings of the nitride film mask, are oxidized, thereby forming an isolation film out of the LOCOS film.

In this process step, a phenomenon that the shift of a rough pattern, formed by transferring the first group of on-mask alignment marks 13a or the isolation film pattern 11 (first on-mask intended pattern) from its ideal position is different from that of the second group of on-mask alignment marks 13b from its ideal position is observed as described above.

Figure 3A:
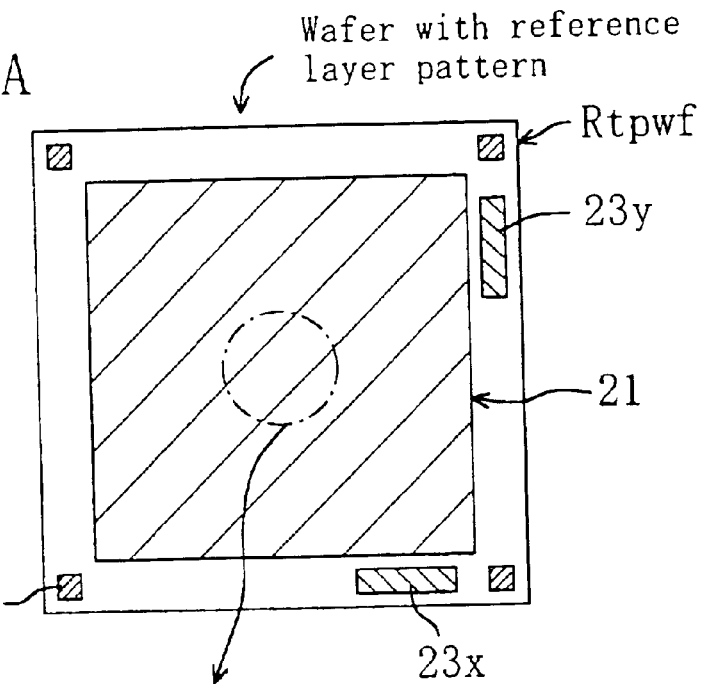
FIGS. 3A through 3C are respectively a plan view illustrating a unit chip region of a wafer on which a reference layer pattern has been defined using the reference-layer-defining photomask, a cross-sectional view illustrating an on-wafer intended pattern region and a cross-sectional view illustrating an on-wafer alignment region in accordance with the first embodiment.
Figure 3B:
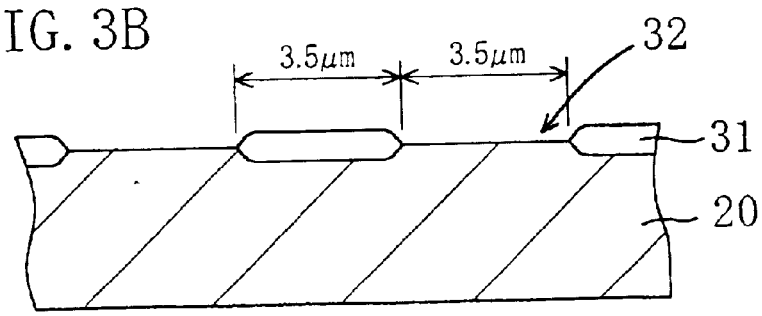
Figure 3C:
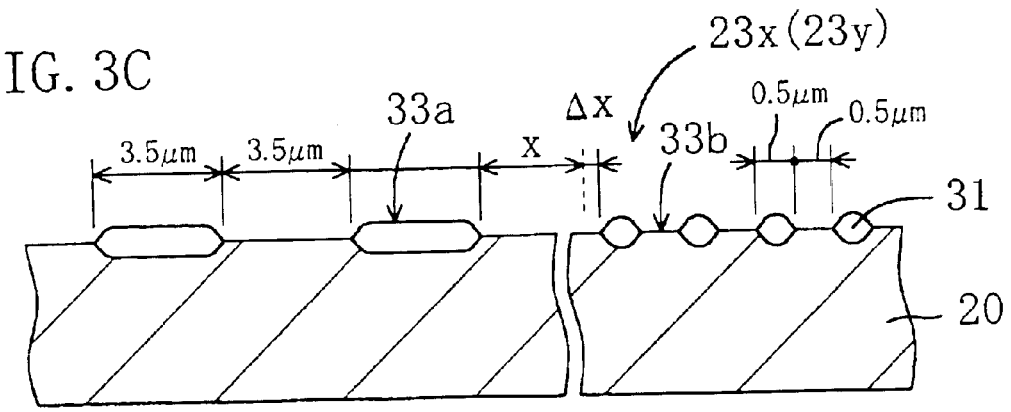

FIGS. 3A through 3C are respectively a plan view illustrating a unit chip region of a wafer on which a reference layer pattern has been defined using the reference-layer-defining photomask shown in FIGS. 1A through 1D, a cross-sectional view illustrating an on-wafer intended pattern region and a cross-sectional view illustrating an on-wafer alignment region. As shown in FIG. 3A, the unit chip region Rtpwf includes the on-wafer intended pattern region 21, on-wafer alignment accuracy measuring regions 22, and first and second on-wafer alignment regions 23x and 23y. An isolation film pattern for transistors to be fabricated in the chip has been defined in the on-wafer intended pattern region 21. Each of the on-wafer alignment accuracy measuring regions 22 includes an alignment accuracy measuring mark for measuring the alignment accuracy. The first and second on-wafer alignment regions 23x and 23y include alignment marks that are necessary for the alignment with a layer-to-be-aligned pattern.

As shown in FIG. 3B, a first on-wafer intended pattern 32 has already been defined by the isolation film 31 and the wafer surface surrounded by the isolation film 31 in the intended pattern region 21 of the Si wafer 20.

Figure 9A:
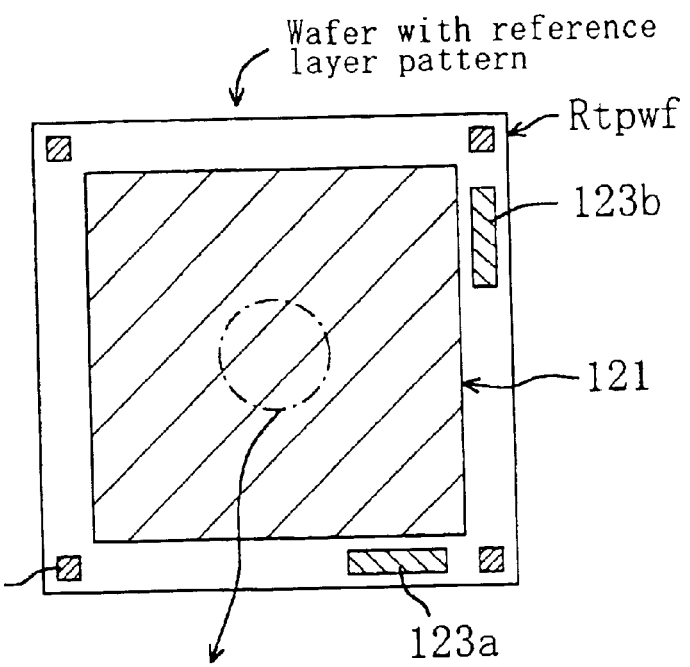
FIGS. 9A through 9D are respectively a plan view illustrating a unit chip region of a wafer on which a reference layer pattern has been defined using the known reference-layer-defining photomask, a cross-sectional view illustrating an on-wafer intended pattern region, a cross-sectional view illustrating an on-wafer alignment accuracy measuring region and a cross-sectional view illustrating an on-wafer alignment region.
Figure 9B:
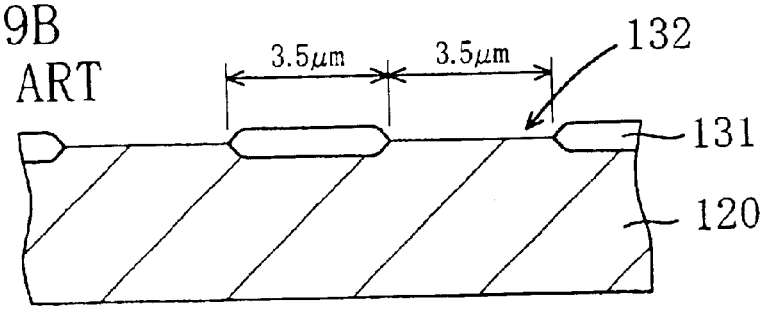
Figure 9C:
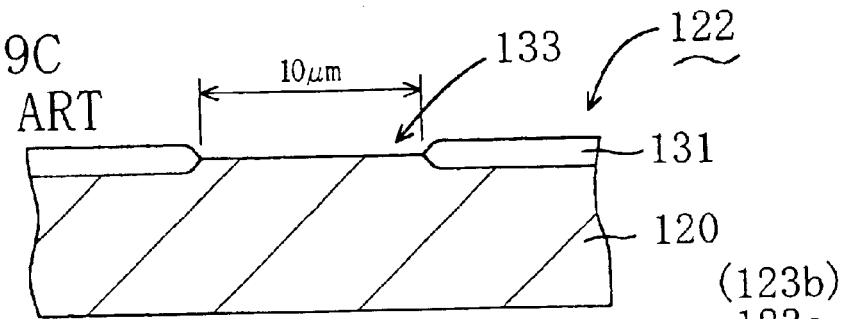
Figure 9D:
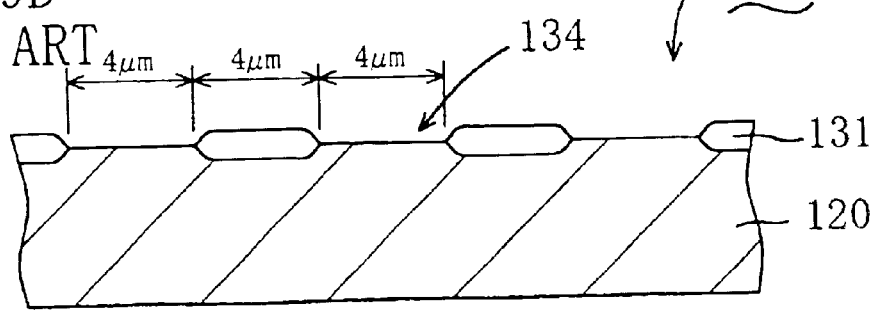
Figure 10A:
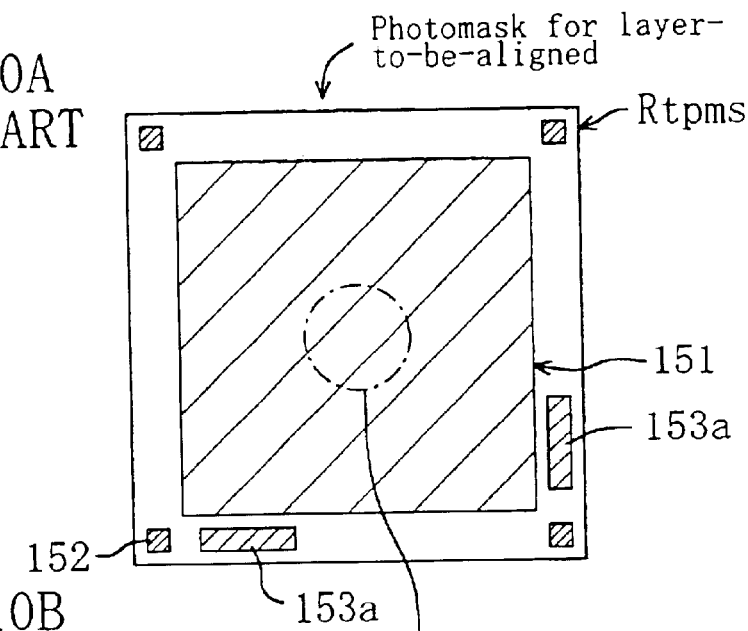
FIGS. 10A through 10D schematically illustrate the planar layouts of overall pattern for a unit chip among the patterns formed on a known layer-to-be-aligned-defining photomask, on-mask intended pattern region, on-mask alignment accuracy measuring region and on-mask alignment region, respectively.
Figure 10B:
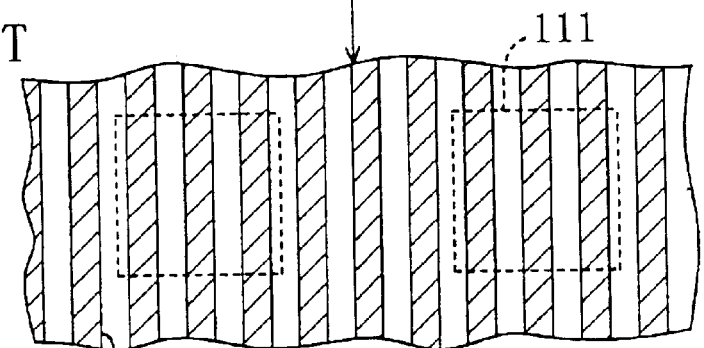
Figure 10C:
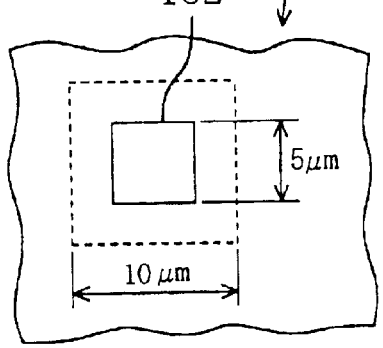
Figure 10D:
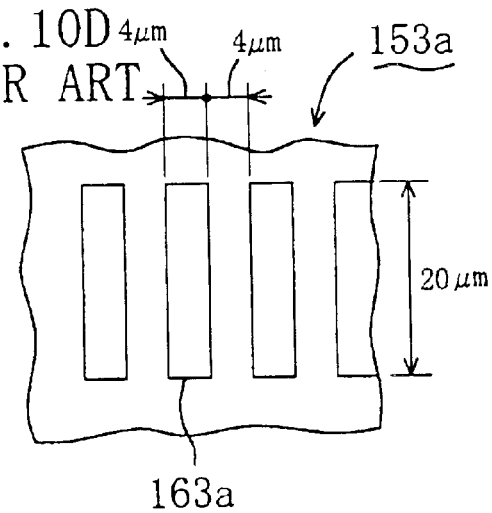
Figure 11A:
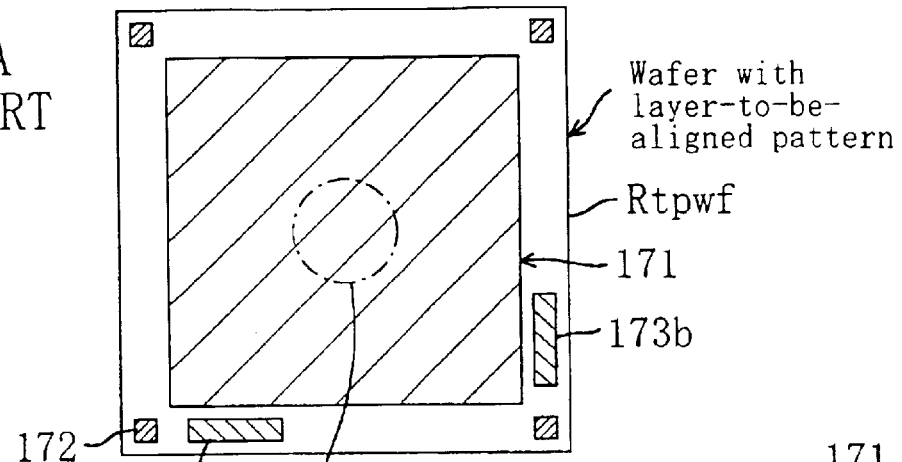
Figure 11B:
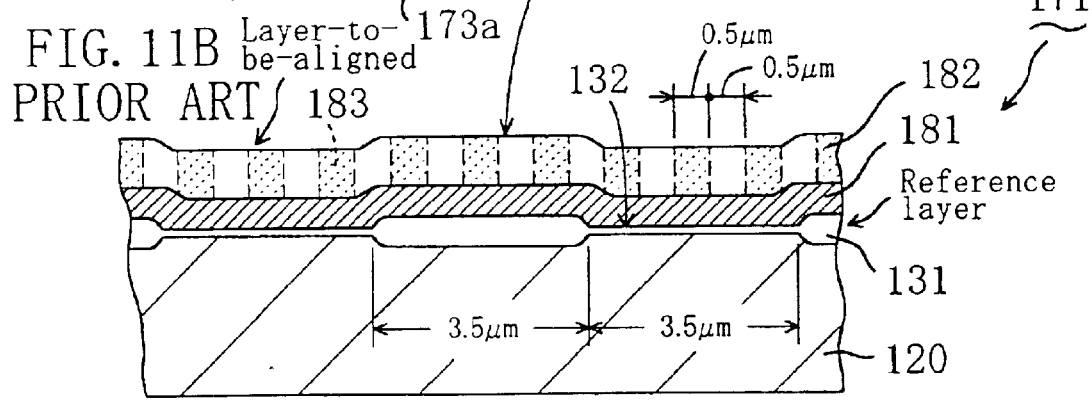
Figure 11C:
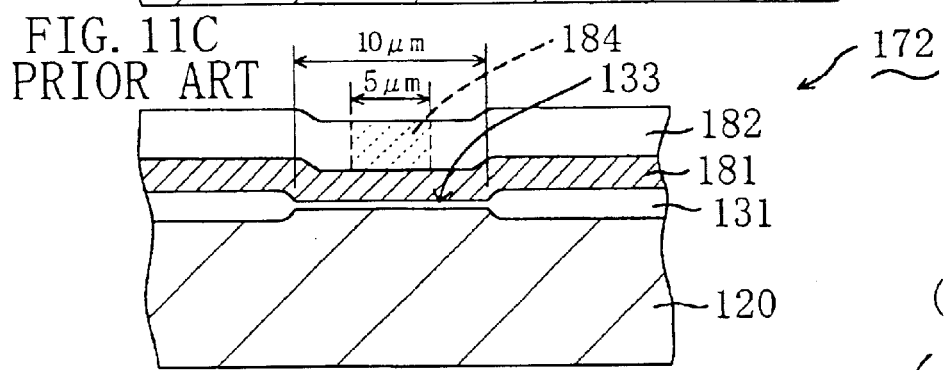
Figure 11C:
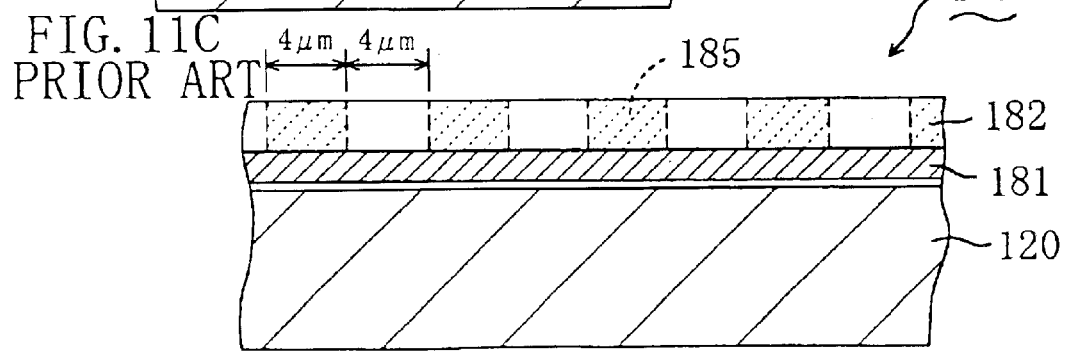
Figure 12:
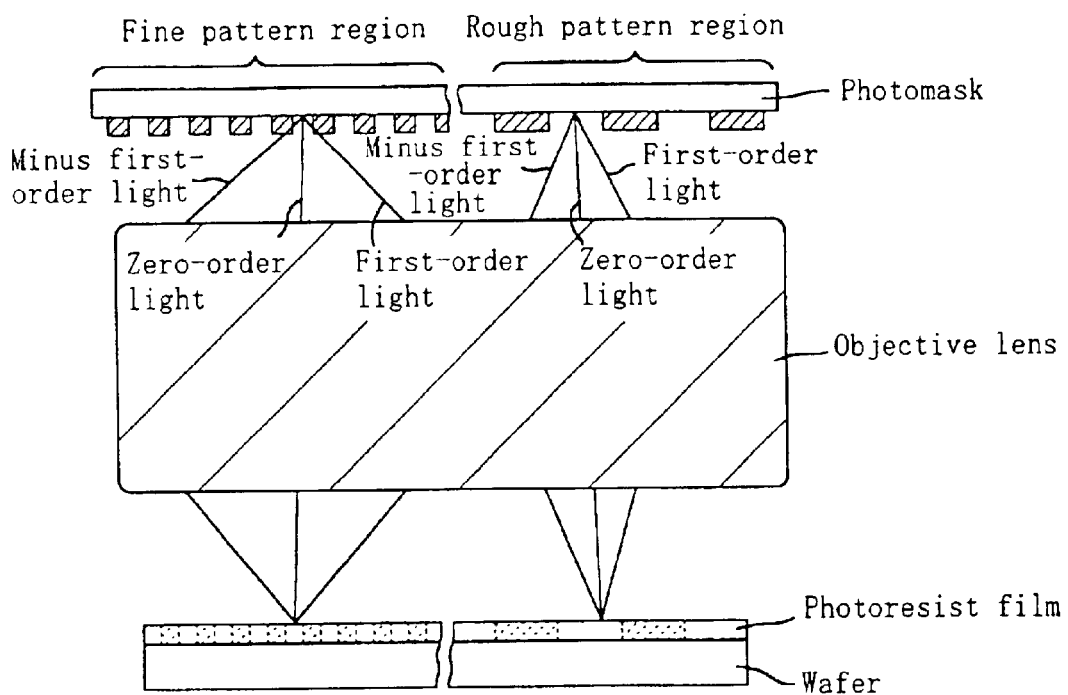
FIG. 12 is a cross-sectional view illustrating the shapes of aligner, photomask and wafer in a known exposure process.
Figure 13:
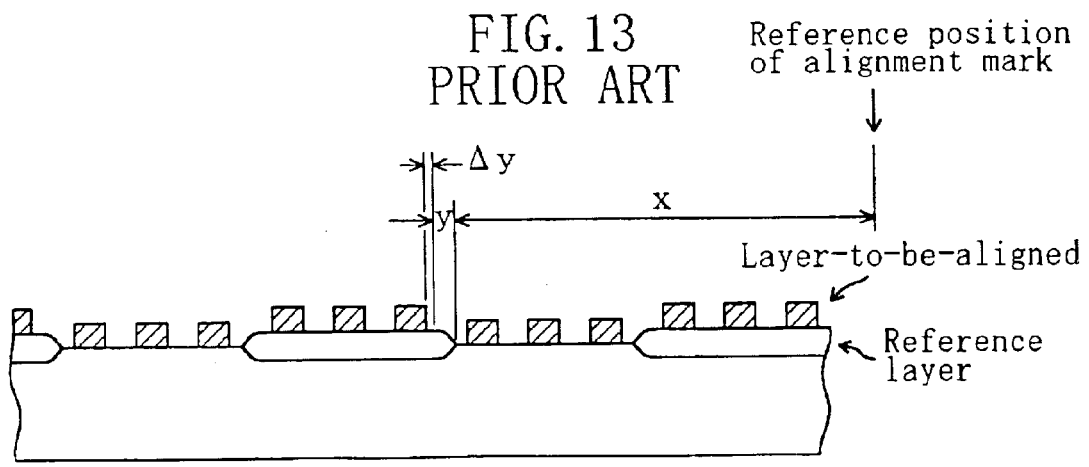
FIG. 13 is a view illustrating how the positions of gate electrodes shift due to the pattern dependence of aberrations in a known alignment method.

Although not shown, each of the alignment accuracy measuring regions 22 on the Si wafer 20 includes an on-wafer alignment accuracy measuring mark having the same shape as that of the known on-wafer alignment accuracy measuring mark shown in FIG. 9C.

As shown in FIG. 3C, first and second groups of on-wafer alignment marks 33a and 33b are arranged in each of the first and second on-wafer alignment regions 23x and 23y on the Si wafer 20. The first group of on-wafer alignment marks 33a are formed by the isolation film 31 and the wafer surface surrounded with the isolation film 31 and have a width of 3.5 μm, a space of 3.5 μm and a length of 20 μm. The second group of on-wafer alignment marks 33b are also formed by the isolation film 31 and the wafer surface surrounded with the isolation film 31 and have a width of 0.5 μm, a space of 0.5 tion film 31 and have a width of 0.5 μm, a space of 0.5 μm and a length of 20 μm.

In this case, a shift Δx is caused as shown in FIG. 3C between any pair of on-wafer alignment marks 33a and 33b of the first and second groups because the diffraction of light affects the rough and fine patterns of the photomask differently. The shift Δx is a shift from the ideal distance x between any pair of on-wafer alignment marks 33a and 33b of the first and second groups where any error occurring during the exposure or development of the photomask, patterning of the nitride film or thermal oxidation of the Si wafer, for example, is regarded as negligible.

Next, it will be described how a layer-to-be-aligned is formed on the reference layer.

FIGS. 4A through 4D schematically illustrate the planar layouts of overall pattern for a unit chip among the patterns formed on a layer-to-be-aligned-defining photomask, on-mask intended pattern region, and first and second on-mask alignment regions, respectively, in accordance with this embodiment. This layer-to-be-aligned-defining photomask is prepared.

Figure 4A:
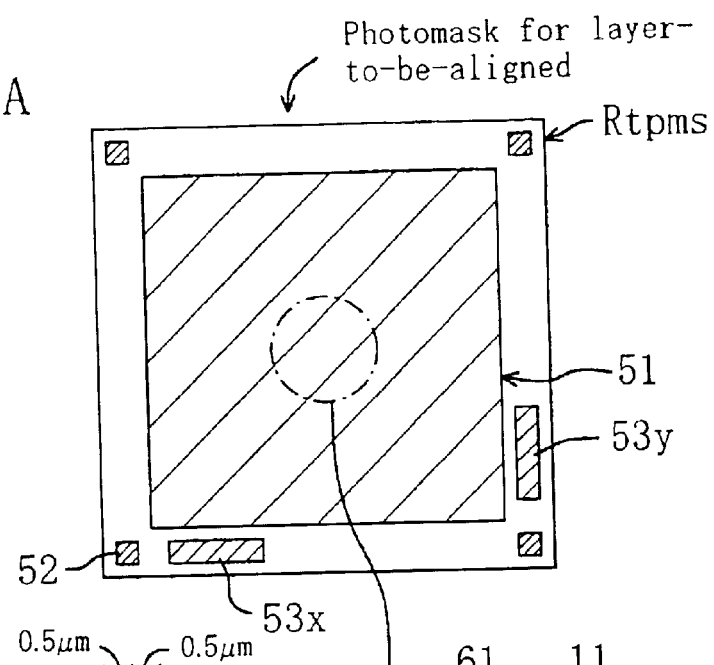
FIGS. 4A through 4D schematically illustrate the planar layouts of overall pattern for a unit chip among the patterns formed on a layer-to-be-aligned-defining photomask, on-mask intended pattern region, and first and second on-mask alignment regions, respectively, in accordance with the first embodiment.

As shown in FIG. 4A, the unit chip region Rtpms of the layer-to-be-aligned-defining photomask includes the on-mask intended pattern region 51, on-mask alignment accuracy measuring regions 52, and first and second on-mask alignment regions 53x and 53y for the next process step. A gate electrode (gate line) pattern for transistors to be fabricated in the chip has been defined in the on-mask intended pattern region 51. The on-mask alignment accuracy measuring regions 52 are for use to measure the alignment accuracy. The first and second on-mask alignment regions 53x and 53y for the next process step are provided for the purpose of the alignment with a photomask to be used in the next process step.

Figure 4B:
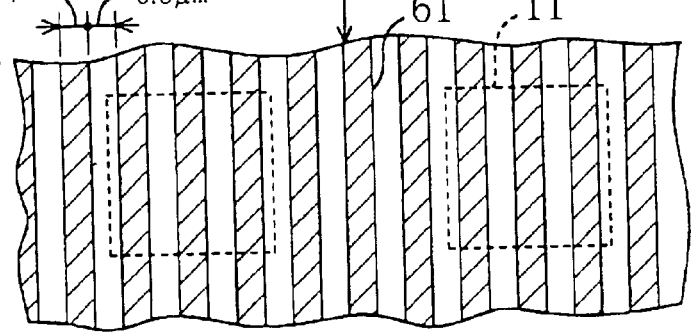

As shown in FIG. 4B, the on-mask intended pattern region 51 includes an on-mask gate pattern 61 for forming gate electrodes (polysilicon film) to be arranged three by three at a width of 0.5 μm and a space of 0.5 μm, for example.

Figure 4C:
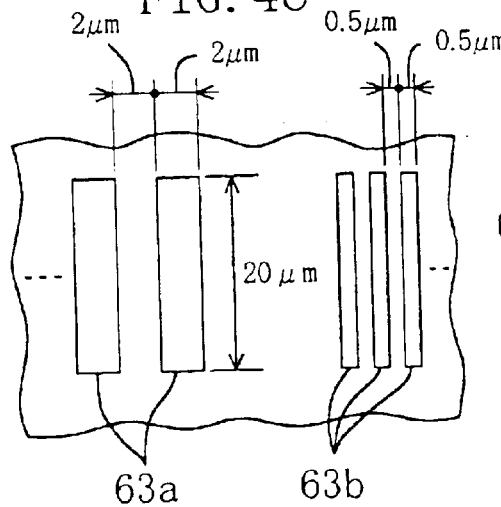

As shown in FIG. 4C, the first on-mask alignment region 53x for the next process step includes first and second groups of on-mask alignment marks 63a and 63b for the next process step. The first group of on-mask alignment marks 63a for the next process step form an elongated line-and-space pattern (e.g., interconnect pattern) with a width of 2.0 μm, a length of 20 μm and a space of 2.0 μm. The second group of on-mask alignment marks 63b for the next process step form an elongated line-and-space pattern (in the same shape as that of the gate pattern in the reference layer) with a width of 0.5 μm, a length of 20 μm and a space of 0.5 μm.

Figure 4D:
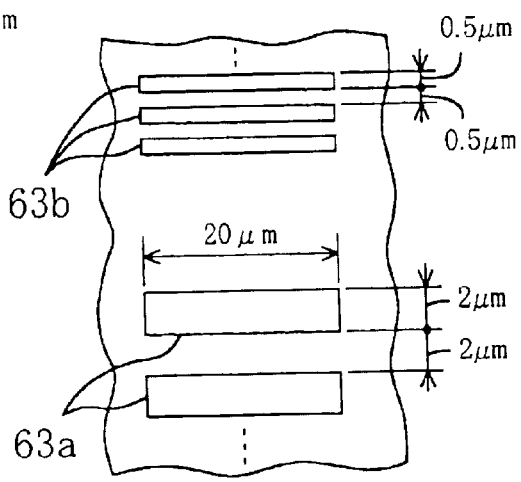

Also, as shown in FIG. 4D, the second on-mask alignment region 53y for the next process step includes an alignment mark pattern, in which the first and second groups of on-mask alignment marks 63a and 63b for the next process step are formed vertically to the counterparts of the first on-mask alignment region 53x for the next process step.

Although not shown, each of the on-mask alignment accuracy measuring regions 52 includes a square on-mask alignment accuracy measuring mark with planar sizes of 5 μm square like the known one.

Next, before the layer-to-be-aligned pattern is formed over the wafer using the layer-to-be-aligned-defining photomask shown in FIGS. 4A through 4C, a shift Δx between the actual and ideal distances between any pair of on-wafer alignment marks 33a and 33b of the first and second groups is measured. The ideal distance is stored in a database for the stepper. The shift Δx is used as a correction for the next alignment step for forming the layer-to-be-aligned pattern.

FIGS. 5A through 5D are respectively a plan view illustrating a unit chip region of a wafer on which a layer-to-be-aligned pattern has been defined using the layer-to-be-aligned-defining photomask shown in FIGS. 4A through 4D, a cross-sectional view illustrating an on-wafer intended pattern region, a cross-sectional view illustrating a reference alignment region, and a cross-sectional view illustrating an on-wafer alignment region.

Figure 5A:
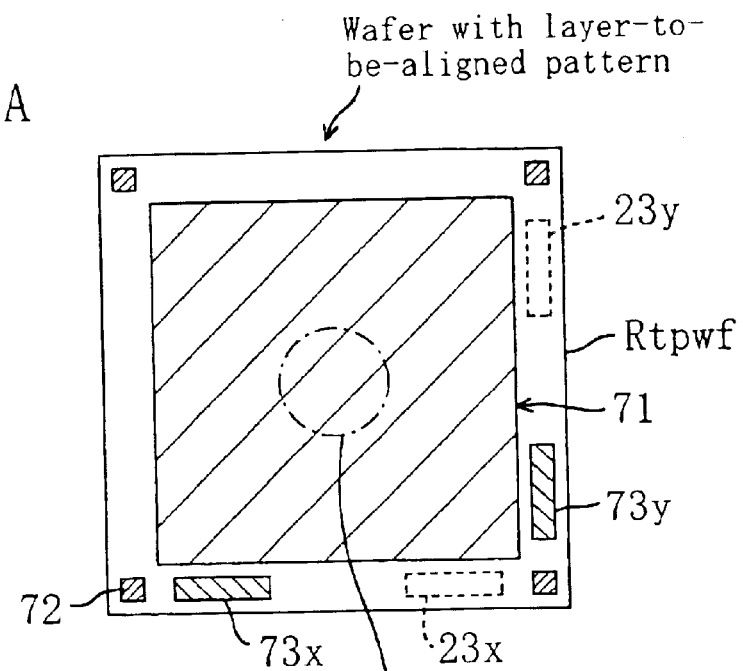
FIGS. 5A through 5D are respectively a plan view illustrating a unit chip region of a wafer on which a layer-to-be-aligned pattern has been defined using the layer-to-be-aligned-defining photomask, a cross-sectional view illustrating an on-wafer intended pattern region, a cross-sectional view illustrating a reference alignment region, and a cross-sectional view illustrating an on-wafer alignment region in accordance with the first embodiment.
Figure 5B:
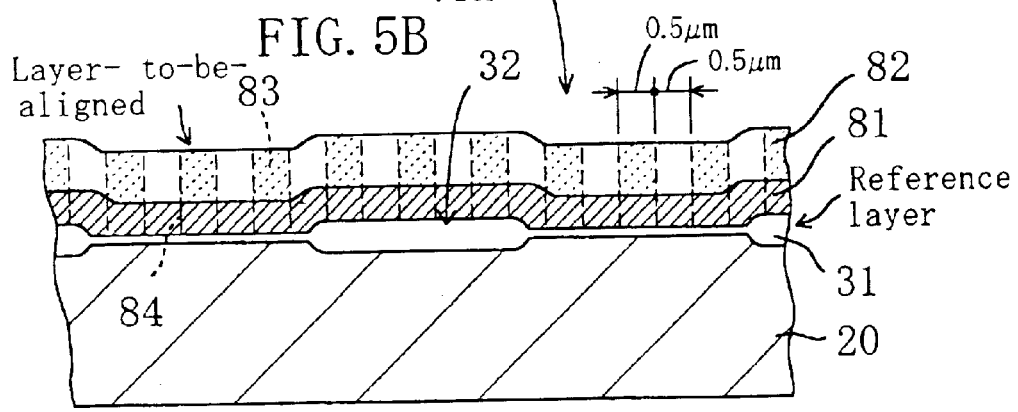
Figures 5C, 5D:
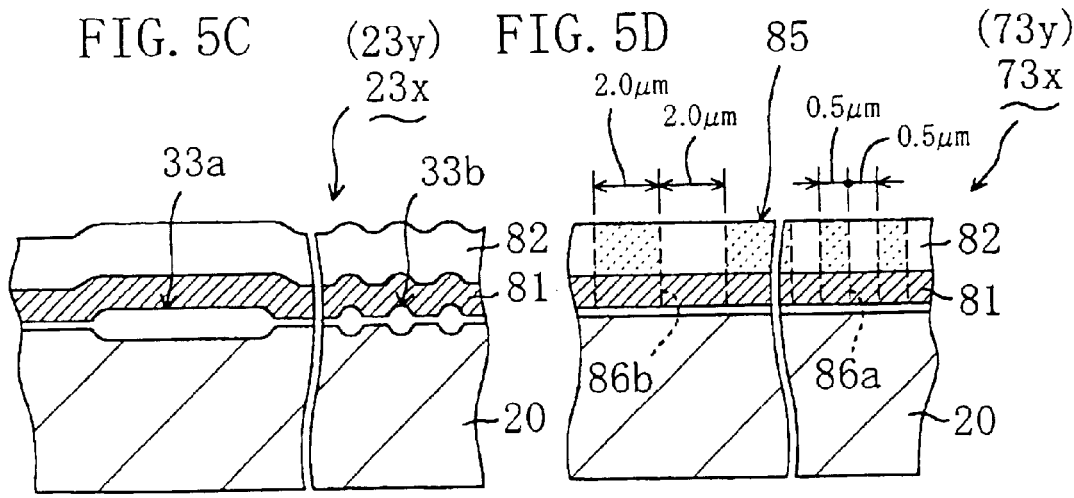

As shown in FIG. 5A, the unit chip region Rtpwf of the wafer includes the on-wafer intended pattern region 71, on-wafer alignment accuracy measuring regions 72, and first and second on-wafer alignment regions 73x and 73y for the next process step. The isolation film pattern for transistors to be fabricated in the chip has been defined in the on-wafer intended pattern region 71. Each of the on-wafer alignment accuracy measuring regions 72 includes an on-wafer alignment accuracy measuring mark for measuring the alignment accuracy. The first and second on-wafer alignment regions 73x and 73y for the next process step include alignment marks that are necessary for the alignment with a photomask to be used in the next process step. As shown in FIGS. 5B and 5C, a polysilicon film 81 for forming gate electrodes therein and a masking photoresist film 82 for patterning the polysilicon film 81 have been formed in the intended pattern region of the Si wafer.

As also shown in FIG. 5B, the on-wafer intended pattern 32 (first on-wafer intended pattern) has already been defined for the reference layer by the isolation film 31 and wafer surface in the on-wafer intended pattern region 71. A gate resist pattern 83 is going to be formed so that a gate pattern 84 (second on-wafer intended pattern) will be made up of multiple gate electrodes arranged three by three at a width of 0.5 μm and a space of 0.5 μm through a patterned process for the layer-to-be-aligned. As shown in FIG. 5C, the poly silicon film 81 and the photoresist film 82 are also formed on the first and second groups of on-wafer alignment marks 33a and 33b for the reference layer, which have been formed in the process step shown in FIGS. 3A through 3C. However, no alignment marks will be newly formed in this region, and no pattern will be defined in this part of the photoresist film.

Then, the mask is automatically aligned by reference to the first group of on-wafer alignment marks 33a (i.e., steps formed on the surface of the polysilicon film 81) for the reference layer shown in FIG. 5C so as to form the gate pattern 84 (on-wafer intended pattern) for the layer-to-be-aligned shown in FIG. 5B.

In this process step of aligning the gate pattern (i.e., a layer to be aligned with the next layer) with the isolation film pattern as the reference layer by reference to the first group of on-wafer alignment marks 33a, a correction is made by the shift Δx that has already been measured. This shift Δx can be measured without using the light that had passed through the photomask, i.e., without being affected by the diffraction of the light caused by the photomask, or irrespective of whether the photomask patterns are rough or fine. Accordingly, the shift Δx accurately represents the shift from the ideal position, which has occurred during the exposure process shown in FIG. 2.

Although not shown, each of the alignment accuracy measuring regions 72 has a box-in-box pattern with an outer frame of 10 μm square and an inner frame of 5 μm square as in the known ones. The box-in-box pattern is formed by each on-wafer alignment accuracy measuring mark for the reference layer and an alignment accuracy measuring mark resist pattern for the layer-to-be-aligned. The resist pattern is formed inside the on-wafer alignment accuracy measuring mark for the reference layer. An alignment error (mask misalignment) between the gate electrode pattern (intended pattern) to be formed using this resist pattern and the pattern of the underlying isolation film, for example, can be read by the relative positional relationship between the outer and inner frames of the box-in-box pattern. This it to say, the alignment accuracy can be measured.

Furthermore, as shown in FIG. 5D, when the polysilicon film 81 is patterned using a resist pattern 85 (see the broken lines) to be formed by exposing and developing the resist film 82 for forming the gate electrodes, first and second groups of on-wafer alignment marks 86a and 86b for the next process step (see the broken lines) are formed in the first and second on-wafer alignment regions 73x and 73y for the next process step. The first group of on-wafer alignment marks 86a for the next process step have the same width and space (which are both 0.5 μm in this embodiment) as those of the gate pattern 84. The second group of on-wafer alignment marks 86b for the next process step have the same width and space (which are both 2 μm in this embodiment) as those of an intended pattern (e.g., interconnect pattern) to be defined in the next process step.

If the alignment error exceeds a predetermined value, the photoresist film is removed, the relative positional relationship between the wafer and photomask is corrected and then a resist pattern is defined all over again.

In the photomask making method and alignment method of this embodiment, the reference-layer-defining photomask includes the first and second groups of on-mask alignment marks 13a and 13b. The first group of on-mask alignment marks 13a have the same space and width as those of the first intended pattern (i.e., the isolation film pattern 33a in this embodiment) for the reference layer. The second group of on-mask alignment marks 13b have the same width and space as those of the second intended pattern (i.e., the gate pattern in this embodiment) for the layer-to-be-aligned. Thus, it is possible to correct a misalignment caused by the diffraction of light that affects rough and fine patterns differently. Specifically, the diffraction of light changes depending on whether the pattern is rough or fine. Accordingly, as shown in FIG. 3C, the distance between any pair of on-wafer alignment marks 33a and 33b of the first and second groups shifts by Δx from the ideal distance x supposing that the error is caused by no other factors. The first group of on-wafer alignment marks 33a have the same width and space as those of the isolation film pattern 32 as the first intended pattern for the reference layer, thus the shifts of the exposure positions due to the diffraction of light can be regarded as substantially the same. Therefore, in aligning the layer-to-be-aligned-defining photomask with the reference layer by reference to the first group of on-wafer alignment marks 33a, a correction is made by the shift Δx. As a result, the gate pattern 84 for the layer-to-be-aligned can be aligned substantially accurately with its reference positions shifted by Δx from the positions where the second group of on-wafer alignment marks 33b have been formed as shown in FIG. 3C. This is to say, the gate pattern 84 can be aligned substantially accurately with the first group of on-wafer alignment marks 33a. That is to say, the gate pattern 84 can be formed so as to be aligned with the isolation film pattern 32 more accurately. Consequently, the alignment accuracy of the alignment process improves.

On the other hand, if the gate pattern is formed by reference to the first group of on-wafer alignment marks 33a as in the known alignment method, the resultant gate pattern would shift from the rough isolation pattern 32 by Δx due to the diffraction of light. As a result, an alignment error would occur. In contrast, in this embodiment, the second group of on-mask alignment marks 13b with the same width and space as those of the gate pattern are formed in advance for the reference-layer-defining photomask. Thus, a misalignment resulting from such a factor can be corrected.

Also, in defining a pattern for the next layer to be aligned with the gate pattern 84 (second intended pattern) for the layer-to-be-aligned, the intended pattern to be defined in the next process step can be accurately aligned with the gate pattern 84 by correcting the misalignment by a shift from an ideal distance between an on-wafer alignment mark 86a of the first group for the next process step, which has the same width and space as those of the gate pattern 84, and an associated on-wafer alignment mark 86b of the second group for the next process step.

It should be noted that where multiple types of members of mutually different sizes should be formed in the layer-to-be-aligned, the second group of on-mask alignment marks 13a may be formed so as to have the same width and space as those of the members of a relatively small (or the smallest if possible) size. This is because the members of the smallest size have the largest shift. Alternatively, the second group of on-mask alignment marks 13b may be formed to have an average width or space of the members.

Embodiment 2

Next, an example in which the present invention is applied to alignment accuracy measuring marks will be described.

In this embodiment, the first and second on-mask alignment regions 3x and 3y, in each of which the first and second groups of on-mask alignment marks 13a and 13b have been arranged, are defined as in the first embodiment. The first and second on-mask alignment regions 53x and 53y for the next process step, in which the first and second groups of on-mask alignment marks 63a and 63b for the next process step have been arranged, are defined in the layer-to-be-aligned-defining photomask as in the first embodiment (see FIGS. 1 through 5). However, in this embodiment, the reference-layer-defining and layer-to-be-aligned-defining photomasks may respectively include on-mask alignment marks and on-mask alignment marks for the next process similar to the known ones.

Unlike the first embodiment, the reference-layer-defining and layer-to-be-aligned-defining photomasks of this embodiment include alignment accuracy measuring marks, each of which has a different shape from that of the known one.

Figure 6A:
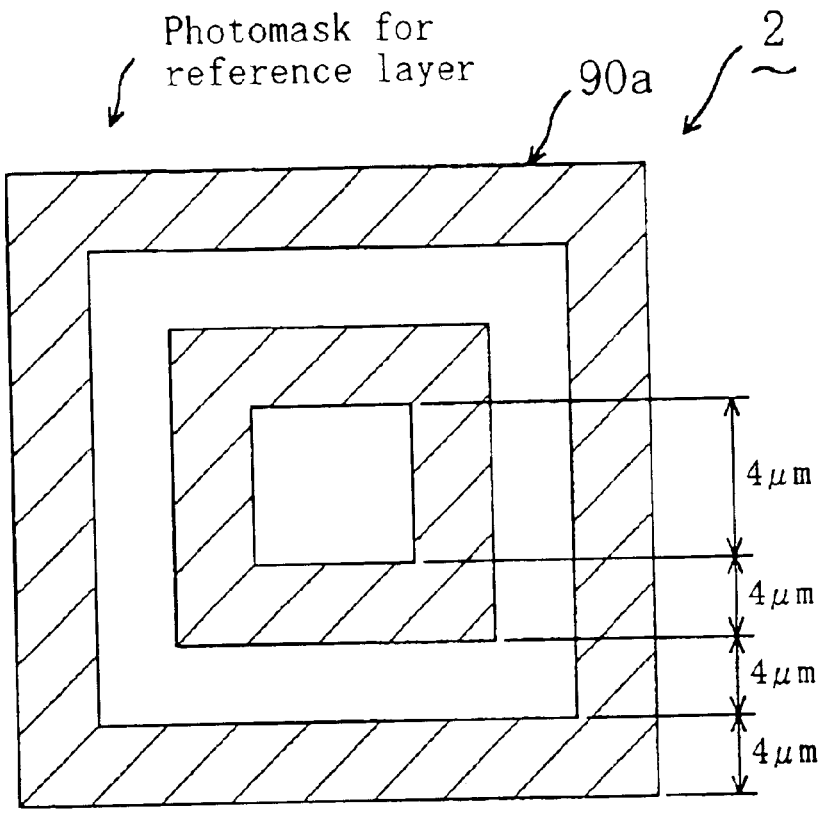
FIGS. 6A and 6B are plan views respectively illustrating the shapes of on-mask alignment accuracy measuring marks formed on reference-layer-defining and layer-to-be-aligned-defining photomasks in accordance with a second embodiment.
Figure 6B:
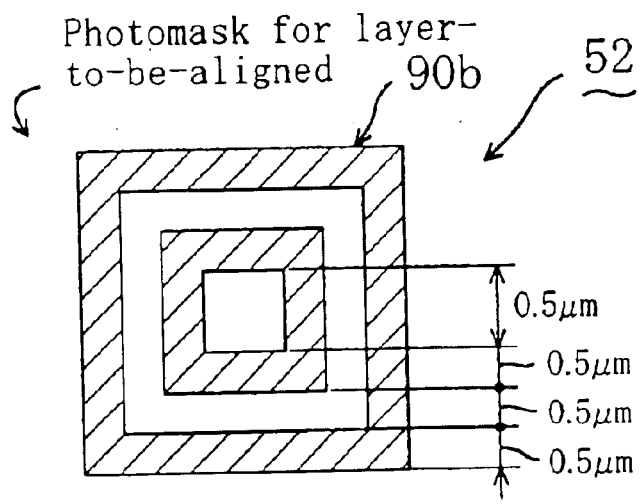

FIGS. 6A and 6B are plan views respectively illustrating the on-mask alignment accuracy measuring marks formed on the reference-layer-defining and layer-to-be-aligned-defining photomasks of this embodiment. As shown in FIG. 6A, an on-mask alignment accuracy measuring region 2 for the reference-layer-defining photomask includes a first on-mask alignment accuracy measuring mark 90a which has a box shape with a width of 3.5 μm and a space of 3.5 μm. As shown in FIG. 6B, an on-mask alignment accuracy measuring region 22 for the layer-to-be-aligned-defining photomask includes a second on-mask alignment accuracy measuring mark 90b which has a box shape with a width of 0.5 μm and a space of 0.5 μm. It should be noted that the reference-layer-defining photomask may include both of the two on-mask alignment accuracy measuring marks 90a and 90b shown in FIGS. 6A and 6B.

Figure 7A:
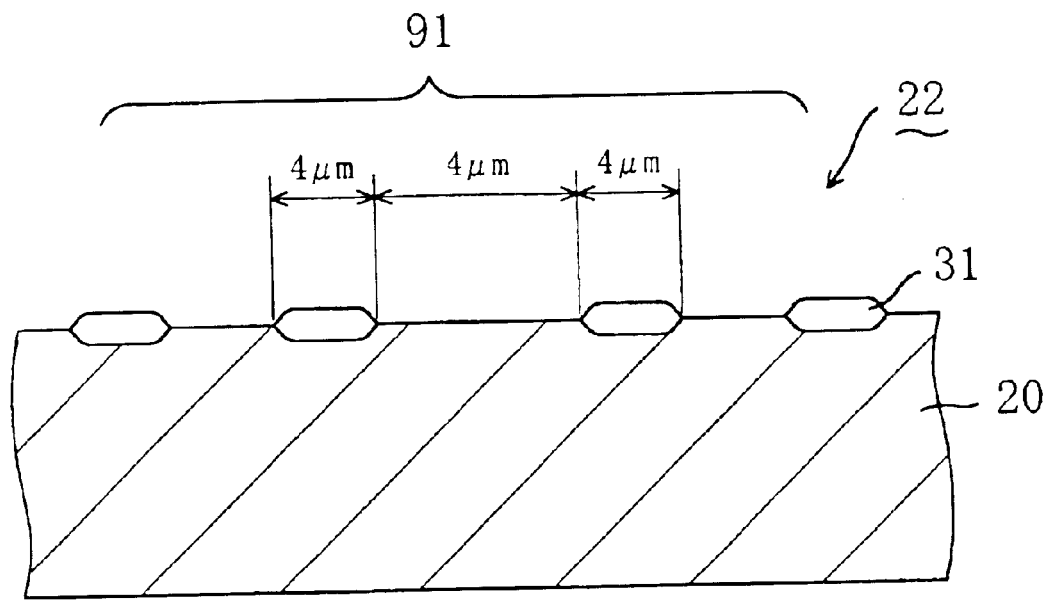
FIGS. 7A and 7B are cross-sectional views illustrating the shapes of a layer-to-be-aligned and a reference layer that have been formed using the photomasks in accordance with the second embodiment.
Figure 7B:
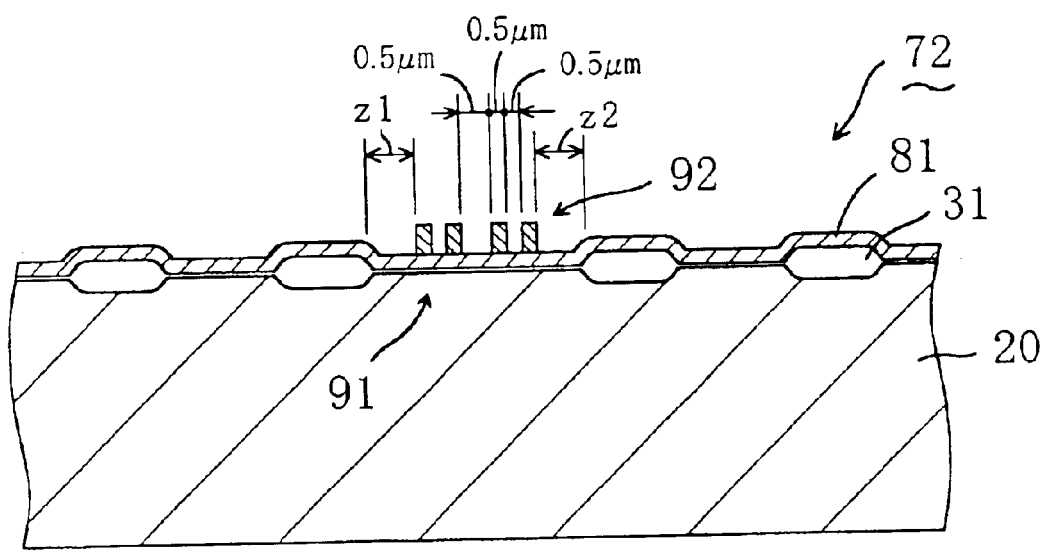
Figure 8A:
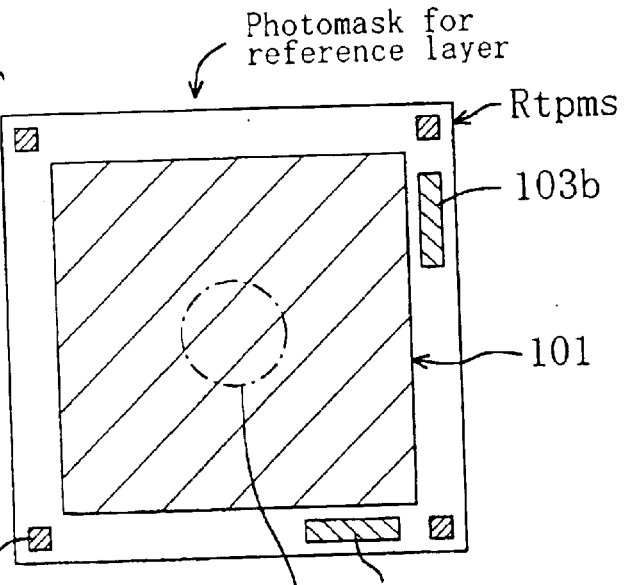
FIGS. 8A through 8D schematically illustrate the planar layouts of overall pattern for a unit chip among the patterns formed on a known reference-layer-defining photomask, on-mask intended pattern region, on-mask alignment accuracy measuring region and on-mask alignment region, respectively.
Figure 8B:
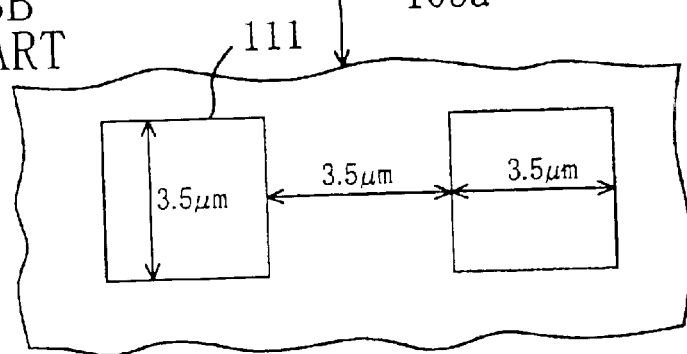
Figure 8C:
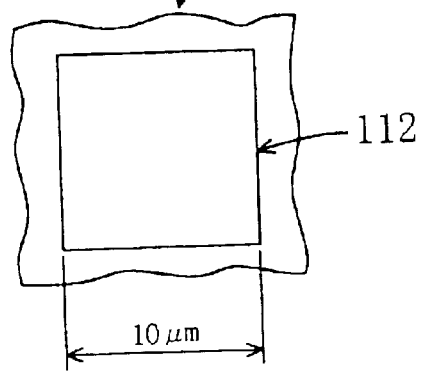
Figure 8D:
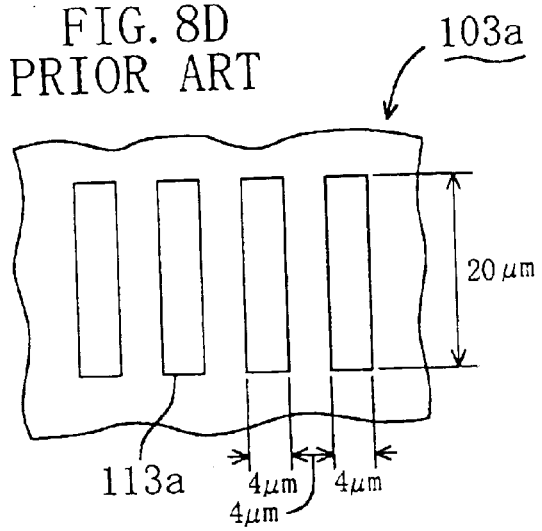

FIGS. 7A and 7B are cross-sectional views illustrating the shapes of a layer-to-be-aligned and a reference layer that have been formed using the photomasks shown in FIGS. 6A and 6B.

As shown in FIG. 7A, the reference layer 22 includes a first on-wafer alignment accuracy measuring mark 91 as part of an isolation film pattern.

Also, as shown in FIG. 7B, the on-wafer alignment accuracy mark region 72 for the layer-to-be-aligned includes a second on-wafer alignment accuracy measuring mark 92 of a polysilicon film over a part of the wafer inside in the innermost part of the first on-wafer alignment accuracy measuring mark 91. The alignment accuracy is measured by the relative positional relationship (as identified by z1 and z2) between the second on-wafer alignment accuracy measuring mark 92 and the outer, first on-wafer alignment accuracy measuring mark 91.

In this embodiment, the spaces measured z1 and z2 are corrected by the shift Δx (see FIG. 3C) obtained by the same measurement method as that of the first embodiment. The correction may be made similarly for a vertical cross section taken vertically to the cross section shown in FIG. 7B. In this manner, an alignment error or an error of the alignment accuracy measured, which is caused by the misalignment of the alignment accuracy measuring marks due to the diffraction of light that affects the rough and fine patterns of the photomask differently, can be corrected.

Also, where both of the two on-mask alignment accuracy measuring marks 90a and 90b shown in FIGS. 6A and 6B are formed in the reference layer, a shift, which is caused by the diffraction of light changing depending on whether the pattern is rough or fine, can be obtained, just like the shift Δx of the first embodiment, by the relative positional relationship between the on-wafer alignment accuracy measuring marks (i.e., part of the isolation film pattern) formed by transferring the marks 90a and 90b onto the wafer. Thus, the alignment error can be corrected as in the first embodiment by correcting the measured spaces z1 and z2 shown in FIG. 7B using the shift obtained.

Examples of alignment methods to which the present invention is applicable include laser scan method, image recognition method and method using an interference pattern formed by holography. However, this invention is applicable to any other alignment method and is not limited to these methods.

Also, in the foregoing embodiments, the alignment marks have been described as forming a line-and-space pattern. However, where the intended pattern is a contact hole pattern or a space pattern, the same results can be obtained by using an alignment pattern in the shape of contacts or a space pattern, respectively.

Further, alignment marks forming an elbow pattern may be used instead of the alignment marks forming the line-and-space pattern of the first embodiment. Then, only one alignment region may be defined for each chip region.

What is claimed is:

1. A photo mask set comprising:
    a first photo mask in which a first intended pattern and a first alignment mark are defined; and
    a second photo mask in which a second intended pattern to overlay with the first intended pattern is defined,
    wherein a part of the second intended pattern, and the first alignment mark have a substantially same width of a pattern and line spacing.

2. The photo mask set claim 1, wherein the both width of pattern and line spacing in the first alignment mark is equal to a part having the smallest width of a pattern and line spacing of the second intended pattern.

3. The photo mask set claim 1:
    wherein the first photo mask in which a first intended pattern, a first alignment mark, and a second alignment mark are defined; and
    wherein the second alignment mark has substantially the same width of a pattern and line spacing as at least part of the first intended pattern.

4. The photo mask set claim 1, wherein the width of a pattern and a space in the first intended pattern is larger than the width of a pattern and a space in the second intended pattern.

5. The photo mask set claim 1, wherein the first intended pattern defines an isolation region, and the second intended pattern defines a gate electrode.

6. An alignment method comprising the steps of:
    forming a first on-wafer intended pattern, and a first on-wafer alignment mark, on a substrate by exposure using a first photo mask in which a first intended pattern, and a first alignment mark, are defined;
    calculating a correction value from declination between the designed first alignment mark and the first on-wafer alignment mark formed on the substrate by exposure; and
    correcting the declination when a second intended pattern having a second photo mask overlays with the first on-wafer intended pattern,
    wherein the first alignment mark in the first photo mask, and the second intended pattern in the second photo mask has a substantially same width of a pattern and line spacing.

7. The alignment method of claim 6, wherein the both width of a pattern and a space in the second alignment mark are equal to a part having the smallest width of a pattern and a space in the second intended pattern.

8. An alignment method according to claim 6:
    wherein the first photo mask in which a first intended pattern, a first alignment mark, and a second alignment mark are defined; and
    wherein the second alignment mark has substantially the same width of a pattern and line spacing as at least a part of the first intended pattern.

9. An alignment method according to claim 8:
    forming a first on-wafer intended pattern, a first on-wafer alignment mark, and a second on-wafer alignment mark on a substrate by exposure using a first photo mask in which the first intended pattern, the first alignment mark, and the second alignment mark are defined;
    calculating a correction value from a declination between a designed distance between the first alignment mark and the second alignment mark, and a real distance between the first on-wafer alignment mark and the second on-wafer alignment mark formed on the substrate by exposure; and
    correcting the declination between the designed distance and the real distance when a second intended pattern having a second photo mask overlays with the first on-wafer intended pattern.

10. An alignment method according to claim 6, wherein the width of a pattern and line spacing in the first intended pattern is larger than the width of a pattern and line spacing of the second intended pattern.

11. An alignment method according to claim 6, wherein the first intended pattern defines an isolation region, and the second intended pattern defines a gate electrode.

* * * * *